United States Patent [19]
Kawasaki

[11] Patent Number: 5,994,940
[45] Date of Patent: Nov. 30, 1999

[54] CLOCK GENERATOR HAVING A PHASE LOCKED LOOP

[75] Inventor: Yoshihiro Kawasaki, Niigata, Japan

[73] Assignee: NEC Corporation, Tokyo, Japan

[21] Appl. No.: 08/974,858

[22] Filed: Nov. 20, 1997

[30] Foreign Application Priority Data

Nov. 25, 1996 [JP] Japan ................................... 8-313273

[51] Int. Cl.⁶ .................................................. G06F 1/04
[52] U.S. Cl. ........................................... 327/291; 327/172
[58] Field of Search .................................... 327/291, 299,
327/171, 172, 173, 174, 175, 176, 159,
63, 67, 563, 147, 149, 156, 158, 393, 395

[56] References Cited

U.S. PATENT DOCUMENTS

| | | | |
|---|---|---|---|
| 5,319,370 | 6/1994 | Signore | 341/120 |
| 5,668,679 | 9/1997 | Swearingen | 360/75 |
| 5,675,340 | 10/1997 | Hester | 341/156 |
| 5,754,072 | 5/1998 | Mazzetti | 327/291 |

*Primary Examiner*—Toan Tran
*Assistant Examiner*—Anh-Quan Tra
*Attorney, Agent, or Firm*—J. Warren Whitesel; Laff, Whitesel & Saret, Ltd.

[57] ABSTRACT

In a system using a microprocessor, a clock generator of the present invention is capable of varying the driving ability of a signal line with an ADC (Analog-to-Digital Conversion)/DAC (Digital-to-Analog Conversion) circuit connected to the signal line. The clock generator can therefore adjust a waveform without resorting to outside adjusting circuitry even if the conditions of loads (number of loads, capacity of the individual load and so forth) to which a clock is fed are varied.

5 Claims, 4 Drawing Sheets

/ 1

CLOCK GENERATOR HAVING A PHASE LOCKED LOOP

BACKGROUND OF THE INVENTION

The present invention relates to a clock generator included in a system using a microprocessor for feeding a clock.

A conventional clock generator for the above application includes an output buffer and a PLL (Phase Locked Loop) logic for clock generation. The clock generator is connected to CPUs (Central Processing Units) or similar receivers via a buffer and a damping circuit. The problem with the conventional clock generator is that the driving ability of the output buffer is fixed. As a result, the number of buffers and the number of damping resistors for wave shaping must be matched to the number of loads, scaling up the circuitry outside of the clock generator and thereby lowering the wiring efficiency while increasing the cost.

Technologies relating to the present invention are disclosed in. e.g., Japanese Patent Laid-Open Publication No. 2-187811.

SUMMARY OF THE INVENTION

It is therefore an object of the present invention to provide a clock generator having a wave shaping function for insuring an ideal waveform at all times, and thereby obviating the problems discussed above.

In accordance with the present invention, in a clock generator including a PLL, an ADC (Analog-to-Digital Conversion)/DAC (Digital-to-Analog Conversion) circuit is arranged on a signal line in order to compare an actual waveform with an ideal waveform and control the actual waveform on the basis of the result of comparison. An output buffer included in the clock generator has a driving ability thereof controlled in accordance with load conditions including a number of loads connected to the output of the clock generator and load capacities, thereby outputting an optimal clock waveform.

Also, in accordance with the present invention, a clock generator including a PLL includes a sampling control/ADC circuit for sampling and coding an actual waveform output from the output of an output buffer included in the clock generator to thereby produce an actual waveform code. A code comparator compares the actual waveform code with a preselected waveform code. A control circuit decodes the result of comparison output from the code comparator in order to control a voltage on the basis of the result. An amplifier amplifies an analog voltage output from the control circuit. The output buffer is controlled by an analog voltage for control output from the amplifier to thereby output an optimal clock waveform.

Further, in accordance with the present invention, a clock generator includes a PLL logic for generating a clock. An output buffer feeds an actual waveform to a receiver. A sampling control/ADC circuit samples and codes the actual waveform being fed from the output buffer to the receiver. A code comparator compares a four-bit actual waveform code output from the sampling/ADC circuit with an ideal waveform code stored in a register beforehand. A decoder decodes the result of comparison output from the code comparator. A voltage control circuit controls a voltage in response to the output of the decoder. An amplifier amplifies an analog voltage produced by the decoder and voltage control circuit. An amplified analog voltage output from the amplifier is applied between the source and the drain of an FET (Field Effect Transistor) included in the output buffer to thereby render a driving ability variable.

Moreover, in accordance with the present invention, a clock generator including a PLL includes a first buffer for feeding an actual waveform to a receiver, and a second buffer for outputting an ideal waveform. A differential amplifier produces a difference between the voltage level of the actual waveform output from the first output buffer and the voltage level of the ideal waveform output from the second output buffer. The output voltage of the differential amplifier controls the first output buffer to thereby output an optimal clock waveform.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
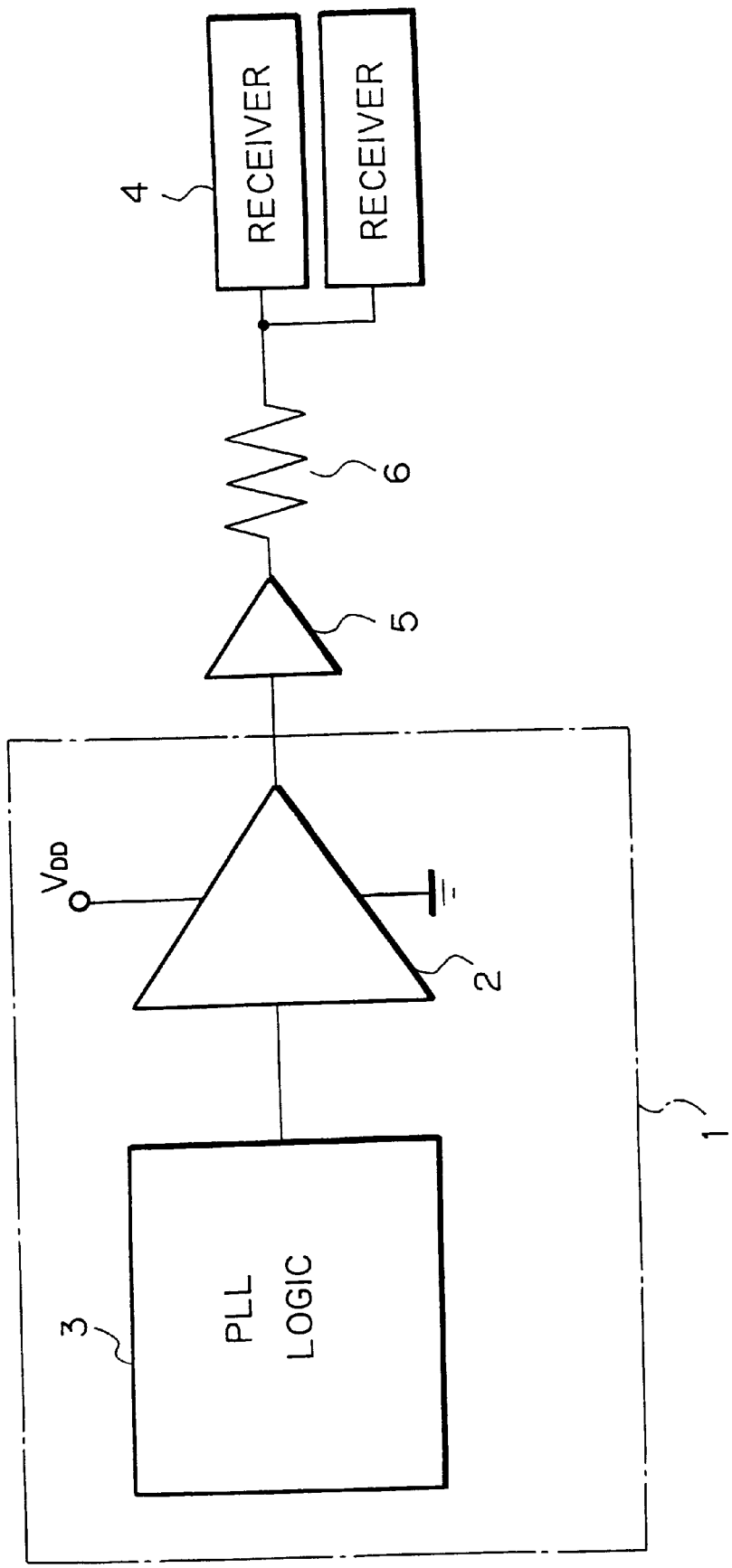
FIG. 1 is a block diagram schematically showing a system including a conventional clock generator.

To better understand the present invention, brief reference will be made to system including a conventional clock generator, shown in FIG. 1. As shown, the system has a clock generator 1, CPUs (Central Processing Units) or similar receivers 4, a buffer 5, and a damping resistor 6. The clock generator 1 is made up of an output buffer 2 and a PLL logic 3 for clock generation. A reference clock $f_{ref}$ is generated by the clock generator 1 and fed to the receivers 4. The clock generator 1 has a fixed driving ability for a single output buffer, so that various conditions of loads to be connected to the clock generator 1 must be taken into account. The conditions of loads include the number of loads and the capacity of the individual load. When the load is heavy, the clock signal presumably has a low edge gradient and needs a long rising time. Conversely, when the load is light, the clock signal presumably has a high edge gradient and rises in a short period of time. This is why the buffer 5 or the damping resistor 6 is inserted in the signal line outside of the clock generator 1, as illustrated.

Specifically, the number of buffers 5 and the number of damping resistors 6 for wave shaping must be matched to the number of loads due to the fixed driving ability of the output buffer 2. This scales up the circuitry outside of the clock generator 1 and thereby lowers the wiring efficiency while increasing the cost.

Figure 2:
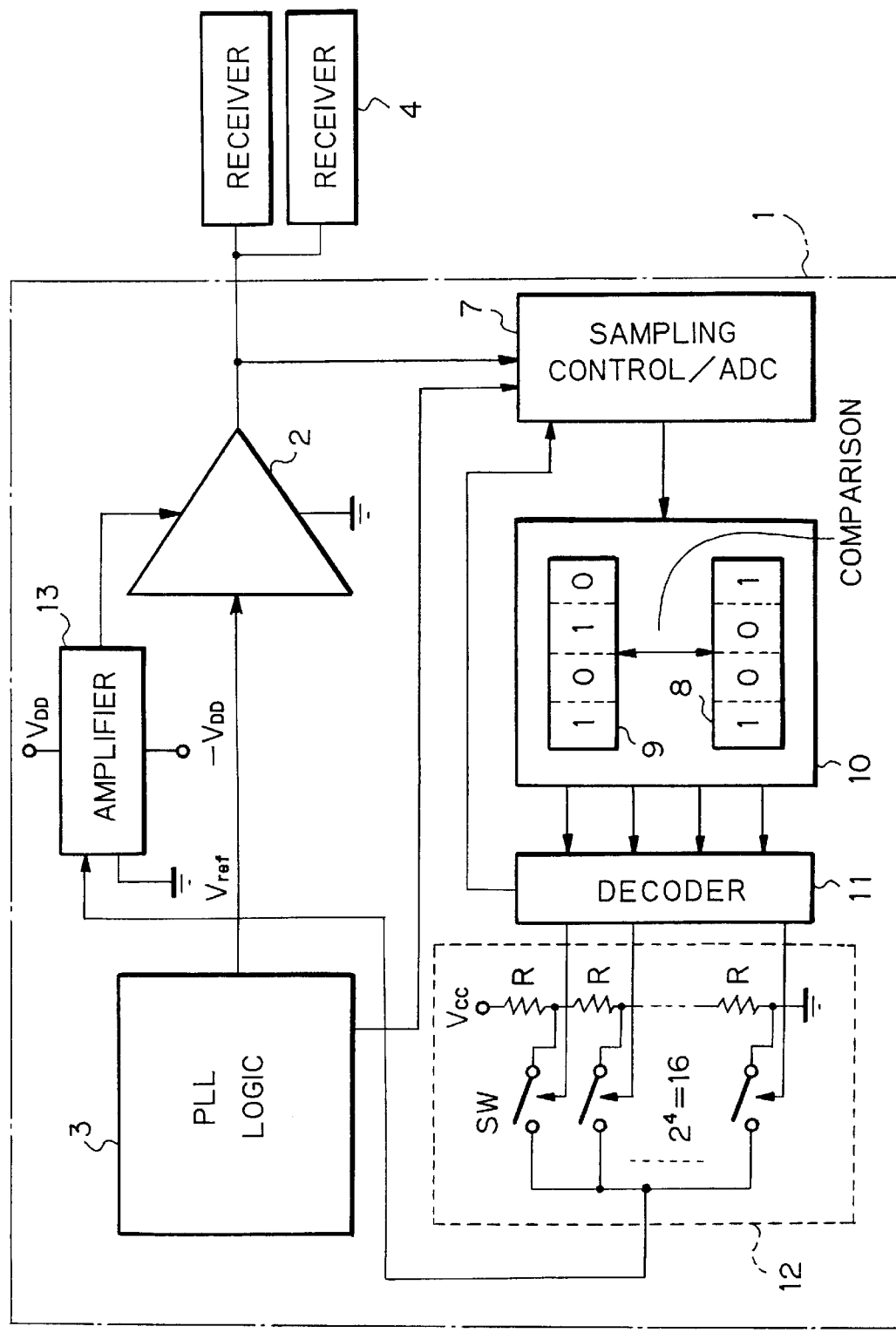
FIG. 2 is a block diagram schematically showing a system including a clock generator embodying the present invention.

Referring to FIG. 2, a system including a clock generator embodying the present invention will be described. As shown, the system includes a clock generator 1 made up of an output buffer 2, a PLL logic 3 for clock generation, a sampling control/ADC 7, a code comparator 10, a decoder 11, a voltage control circuit 12 for controlling a voltage, and an amplifier 13. The sampling control/ADC 7 samples and codes the actual waveform being fed from the output buffer 2 to receivers 4, and feeds the resulting four-bit actual waveform code 8 to the code comparator 10. In response, the code comparator 10 compares the actual waveform code 8 with a preselected ideal waveform code 9. The decoder 11 decodes the result of comparison output from the code comparator 10. The amplifier 13 amplifies an analog voltage produced by the decoder 11 and voltage control circuit 12.

Figure 3:
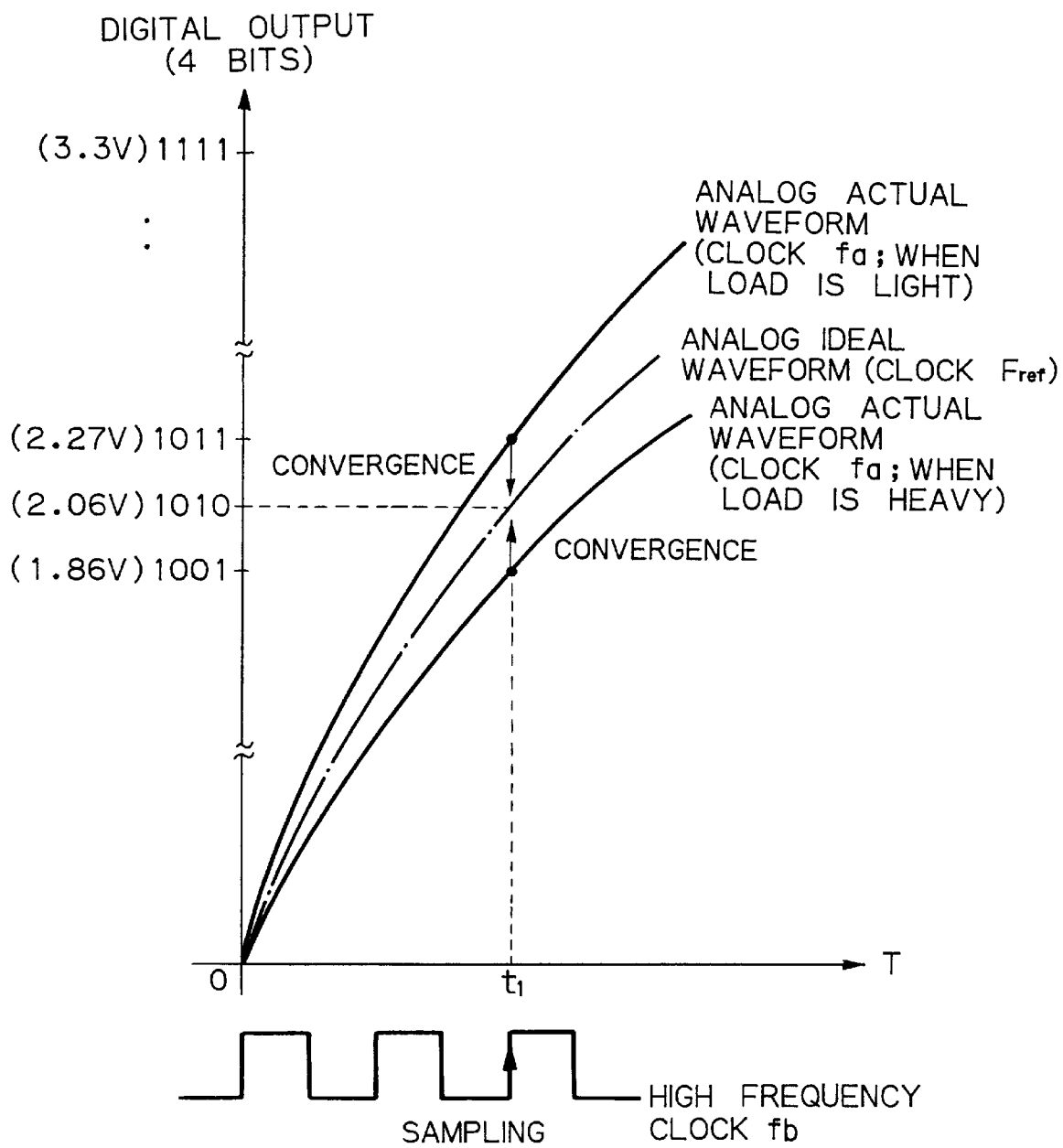
FIG. 3 is a graph showing a digitized value representative of an analog ideal waveform at a given time $t_1$, a digitized value representative of an analog actual waveform at the time $t_1$, and digital output codes corresponding to the digitized values.

FIG. 3 shows a curve representative of digitized values of the analog ideal waveform, a curve representative of digitized values of the analog actual waveform appearing when the load is heavy, and a curve representative of digitized values of the analog actual waveform appearing when the load is light. In FIG. 3, the abscissa and ordinate indicate time T and four-bit digital output codes, respectively, and a given time is labeled $t_1$. The time $t_1$ is denoted by the integral multiple of the reciprocal of a high frequency clock $f_b$ output from the PLL logic 3. An ideal waveform code (2.06 V in FIG. 3) associated with the digitized value of the level of the analog ideal waveform at the time t1 is indicated on the ordinate. This reference waveform code 9 is stored in a register included in the code comparator 10 beforehand.

A sequence of steps to be executed by the illustrative embodiment will be described hereinafter.

(a) The rise of the analog input signal at the given time $t_1$ (actual analog waveform; clock $f_a$) is sampled at the positive-going edge of the clock $f_b$. The sampled voltage level is quantized and coded.

(b) The comparator 10 compares the four-bit actual waveform code 8 produced in the step (a) and the preselected ideal waveform (clock $F_{ref}$) at the time $t_1$.

(c) Digital data output in the step (b) is input to the decoder 11 and voltage control circuit 12 in order to control the voltage. As for the minimum voltage adjustment, assume that the minimum unit q is about 0.2 V which is produced by dividing the analog voltage input range (3.3) by the division number ($2^4$). In the specific condition shown in FIG. 2, the digital value representative of the actual waveform at the time $t_1$ is "1001" which is 0.2 V smaller than the ideal value of "1010" in terms of voltage level (see FIG. 3). In this case, the decoder 11 causes the voltage controller 12 to output an analog signal $V_1$ for raising the voltage by 0.2 V.

(d) The voltage controlled by the decoder 11 and voltage control circuit 12 as stated above is input to the amplifier 13. The resulting analog voltage $V_0$ output from the amplifier 13 is equal t a difference between the ideal reference voltage $V_{ref}$ and the voltage $V_1$:

$$V_0 = A(V_{ref} - V_1)$$

where A denotes a gain. Assuming that $V_{ref}$ is equal to ground potential GND (0 V), then there holds:

$$V_0 = A(V_{ref} - V_1) = A(0 - (-0.2)) = A \times 0.2$$

Therefore, only if the gain A is preselected in accordance with the output characteristic of FETs (Field Effect Transistors) included in the clock generator 1, it is possible to control a voltage between the source and the drain of the FET of the output buffer 2 such that the voltage of the actual waveform increases by 0.2 V. As a result, the amount of current is so adjusted as to increase the voltage level by 0.2 V.

The time for sampling the actual waveform again after the above sequence of steps (a)–(d) is controlled by the sampling control/ADC 7. Assume that no difference exists between the actual waveform code resulting from the next sampling and ADC and the ideal waveform code. Then, the decoder 11 delivers a control signal to the sampling control/ADC 7. In response, the sampling control/ADC 7 stops ADC/DAC. Such a procedure is repeated to cause the actual waveform to converge to the ideal waveform.

Figure 4:
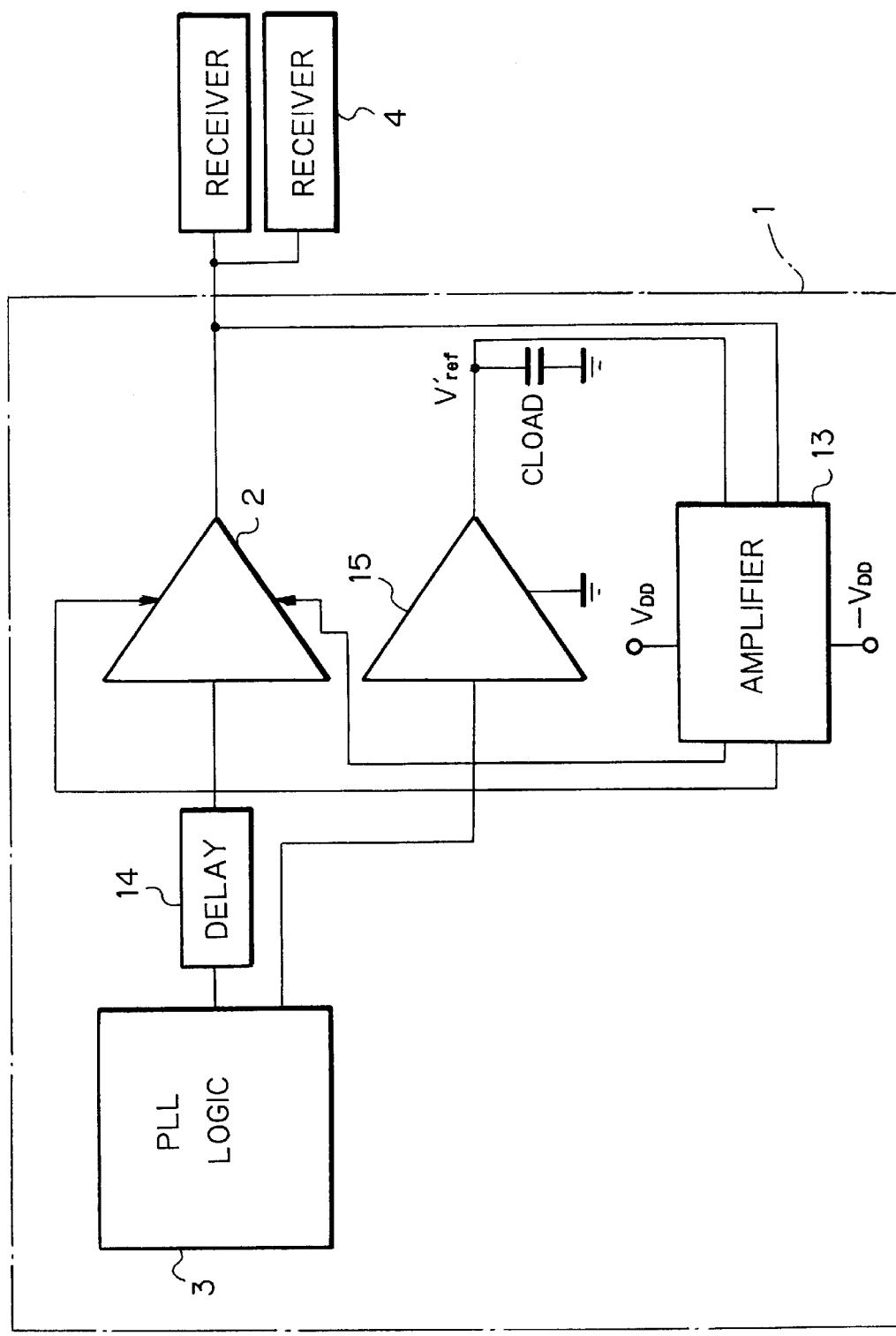
FIG. 4 is a schematic block diagram showing an alternative embodiment of the present invention In the drawings, identical references denote identical structural elements.

FIG. 4 shows an alternative embodiment of the present invention. As shown, the clock generator 1 also includes the PLL logic 3 for clock generation and output buffer 2. In this embodiment, an output buffer 15 outputs an ideal waveform while the amplifier 13 is implemented as a differential amplifier. The differential amplifier 13 receives the actual waveform being fed from the output buffer 2 to the receivers 4 and the ideal waveform output from the output buffer 15. The amplifier 13 produces a difference between the voltage level of the actual waveform and that of the ideal waveform.

Specifically, in the clock generator 1, a load capacity $C_{load}$ is connected to the output of the output buffer 15 so as to produce a voltage level $V_{ref}$ representative of the ideal waveform. The voltage level $V_{ref}$ is input to the differential amplifier 13

The differential amplifier 13 constantly compares the voltage level $V_2$ of the actual waveform and the voltage level $V_{ref}$ of the ideal waveform. A control voltage corresponding a voltage produced by $V_0 A(V_{ref} - V_2)$ is applied between the source and the drain of the FET included in the output buffer 2. This is also successful to achieve the advantages described in relation to the previous embodiment.

Further, the embodiment shown in FIG. 4 is simpler in circuit configuration than the embodiment shown in FIG. 2. Moreover, the differential amplifier 13 may constantly output the difference between the actual waveform and the ideal waveform without regard to the rise/fall of the waveform. This can be done if a delay 14 is inserted for matching the phase of the actual waveform and that of the ideal waveform. In this configuration, if the resulting control voltage is applied to the output buffer 2, the actual waveform can be brought closer to the ideal waveform.

In summary, in accordance with the present invention, a clock generator is capable of varying the driving ability of a signal line with an ADC/DAC circuit connected to the signal line. The clock generator can therefore adjust a waveform without resorting to outside adjusting circuitry even if the previously mentioned conditions of loads to which a clock is fed are varied.

Various modifications will become possible for those skilled in the art after receiving the teachings of the present disclosure without departing from the scope thereof.

What is claimed is:

1. A clock generator including a PLL, comprising:
    a sampling control/ADC circuit for sampling and coding an actual waveform output from an output of an output buffer included in said clock generator to thereby produce an actual waveform code;
    a code comparator for comparing said actual waveform code with a preselected waveform code;
    a control circuit for decoding a result of comparison output from said code comparator in order to control a voltage on the basis of said result; and
    an amplifier for amplifying an analog voltage output from said control circuit;
    said output buffer being controlled by an analog voltage for control output from said amplifier to thereby output an optimal clock waveform.

2. A clock generator comprising:

a PLL logic for generating a clock;

an output buffer for feeding an actual waveform to a receiver;

a sampling control/ADC circuit for sampling and coding the actual waveform being fed from said output buffer to said receiver;

a code comparator for comparing a four-bit actual waveform code output from said sampling/ADC circuit with an ideal waveform code stored in a register beforehand;

a decoder for decoding a result of comparison output from said code comparator;

a voltage control circuit for controlling a voltage in response to an output of said decoder; and an amplifier for amplifying an analog voltage produced by said decoder and said voltage control circuit;

wherein an amplified analog voltage output from said amplifier is applied between a source and a drain of an FET included in said output buffer to thereby render a driving ability variable.

3. A clock generator including a PLL, comprising:

a first buffer for buffering an actual waveform from the PLL to a receiver;

a second buffer for buffering an ideal waveform from the PLL; and a differential amplifier for producing a difference between a voltage level of the actual waveform output from an output of said first output buffer and a voltage level of the ideal waveform output from an output of said second output buffer;

wherein an output voltage of said differential amplifier controls said first output buffer to thereby output an optimal clock waveform.

4. A clock generator as claimed in claim 3, further comprising a load capacity connected to the output of said second buffer to thereby output the ideal waveform.

5. A clock generator as claimed in claim 3, further comprising a delay circuit preceding said first output buffer for matching a phase of the actual waveform and a phase of the ideal waveform.

* * * * *